(12) United States Patent
Cho et al.

(10) Patent No.: US 10,164,604 B2
(45) Date of Patent: Dec. 25, 2018

(54) CRYSTAL DEVICE

(71) Applicant: SAMSUNG ELECTRO-MECHANICS CO., LTD., Suwon-Si, Gyeonggi-Do (KR)

(72) Inventors: Won Sup Cho, Suwon-si (KR); Katsushi Yasuda, Suwon-si (KR); Sang Yeob Cha, Suwon-si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 273 days.

(21) Appl. No.: 14/988,473

(22) Filed: Jan. 5, 2016

(65) Prior Publication Data

US 2016/0308508 A1 Oct. 20, 2016

(30) Foreign Application Priority Data

Apr. 20, 2015 (KR) ........................ 10-2015-0055358

(51) Int. Cl.
| | | |
|---|---|---|
| *H03H 9/17* | (2006.01) | |
| *H01L 41/047* | (2006.01) | |
| *H01L 41/053* | (2006.01) | |
| *H03H 9/08* | (2006.01) | |
| *H03H 9/02* | (2006.01) | |
| *H03H 9/05* | (2006.01) | |

(52) U.S. Cl.
CPC ........... *H03H 9/17* (2013.01); *H01L 41/0475* (2013.01); *H01L 41/053* (2013.01); *H03H 9/02102* (2013.01); *H03H 9/0519* (2013.01); *H03H 9/0547* (2013.01); *H03H 9/08* (2013.01)

(58) Field of Classification Search
CPC .............. H01L 41/0475; H01L 41/053; H03H 9/02102; H03H 9/08
USPC ........................................................ 310/344
See application file for complete search history.

(56) References Cited

U.S. PATENT DOCUMENTS

| | | | | |
|---|---|---|---|---|
| 2005/0088299 A1* | 4/2005 | Bandy | ................ | G01N 33/0075 340/539.16 |
| 2008/0197755 A1* | 8/2008 | Miyahara | ............. | H03H 9/0542 310/360 |
| 2013/0009521 A1* | 1/2013 | Nakanishi | ............ | H03H 9/1021 310/365 |
| 2014/0184019 A1* | 7/2014 | Yamato | ................ | H03H 9/0576 310/313 R |
| 2015/0077190 A1* | 3/2015 | Chiang | .............. | H03H 9/02102 331/66 |
| 2015/0280686 A1* | 10/2015 | Robinson | ............. | H03H 9/0547 310/321 |

FOREIGN PATENT DOCUMENTS

| | | |
|---|---|---|
| KR | 10-2014-0057704 A | 5/2014 |
| KR | 10-2014-0098940 A | 8/2014 |

* cited by examiner

*Primary Examiner* — Bryan P Gordon
(74) *Attorney, Agent, or Firm* — McDermott Will & Emery LLP

(57) ABSTRACT

A crystal device includes a package including a cavity formed therein, a thermistor disposed on a bottom surface of the cavity and integrated with the package, a crystal blank spaced apart from the thermistor in the cavity, and a lead coupled to the package so as to cover the cavity.

11 Claims, 4 Drawing Sheets

CRYSTAL DEVICE

CROSS-REFERENCE TO RELATED APPLICATION

This application claims the benefit of priority to Korean Patent Application No. 10-2015-0055358, filed on Apr. 20, 2015 with the Korean Intellectual Property Office, the entirety of which is incorporated herein by reference.

TECHNICAL FIELD

The present disclosure relates to a crystal device.

BACKGROUND

Crystal devices are used in various fields and in various devices such as computers, communications devices, artificial satellites, and measuring instruments. In particular, crystal devices are essential components for the generation of vibrations having a frequency for controlling signal transmission and reception in a mobile communications terminal.

A crystal device uses a crystal blank as a vibration medium. A vibration frequency of the crystal blank may be changed according to an ambient temperature, and thus, the crystal device requires a function of compensating for frequency variations according to changes in temperature.

Accordingly, a temperature compensated crystal oscillator (TCXO) has been proposed, but in this regard, a structure of the TCXO may be relatively complicated and there may be limitations on miniaturizing the TCXO.

SUMMARY

According to an aspect of the present disclosure, a crystal device includes a package having a cavity formed therein, a thermistor formed on a bottom surface of the cavity to be integrated with the package, a crystal blank disposed in the cavity, and a lead covering the cavity.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
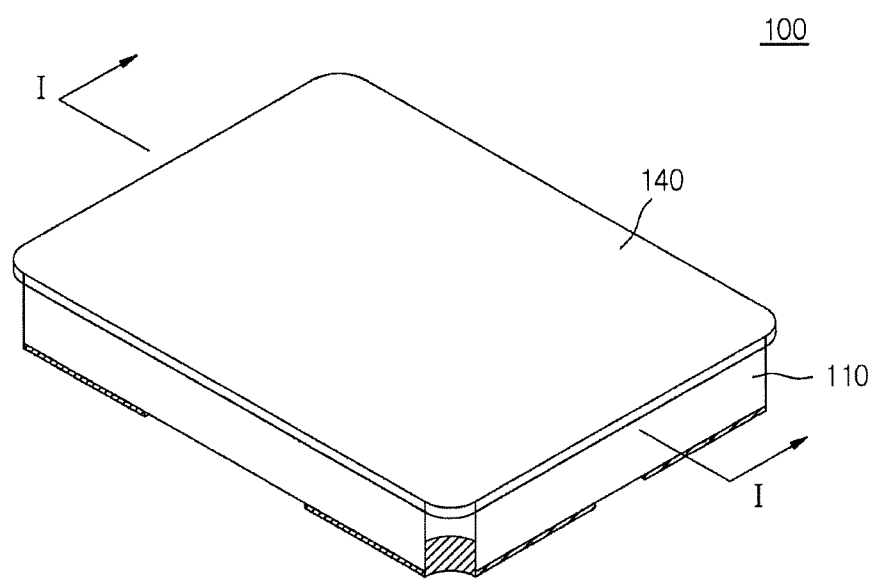
FIG. 1 is a schematic perspective view of a crystal device according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements maybe exaggerated for clarity, and the same reference numerals will be used throughout to designate the same or like elements.

FIG. 1 is a view of a crystal device 100 according to an exemplary embodiment in the present disclosure.

FIG. 1 illustrates an external appearance of the crystal device 100 according to an exemplary embodiment in the present disclosure. The external appearance of the crystal device 100 may be changed according to a coupling shape of a package 110 and a lead 140.

That is, the lead 140 may be coupled to one surface of the package 110 to constitute a portion of the external appearance of the crystal device 100. Each of the package 110 and the lead 140 may be formed to have a plate shape having a predetermined thickness, and the package 110 and the lead 140 may have shapes corresponding to each other.

Figure 2:
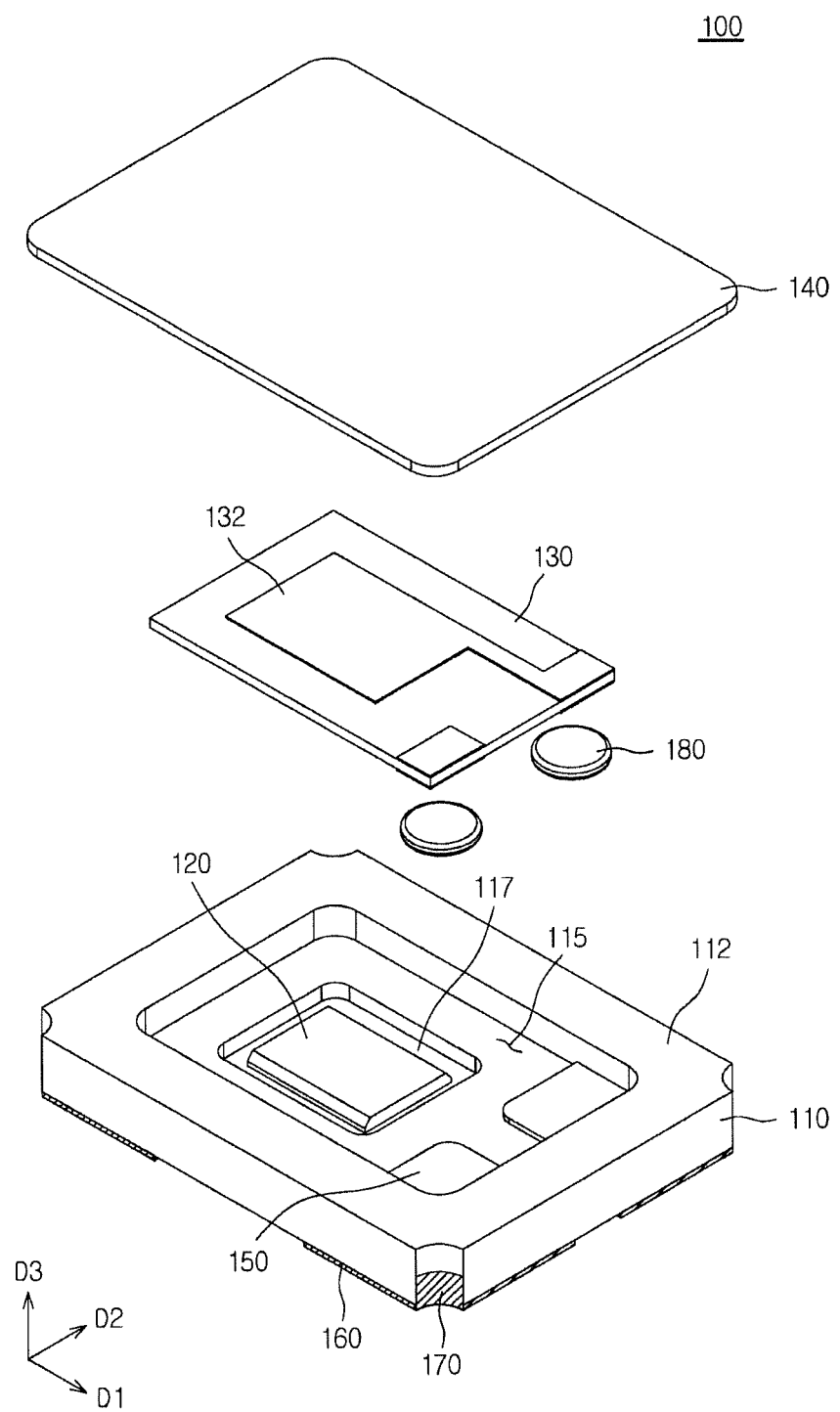
FIG. 2 is an exploded perspective view of the crystal device illustrated in FIG. 1.
Figure 3:
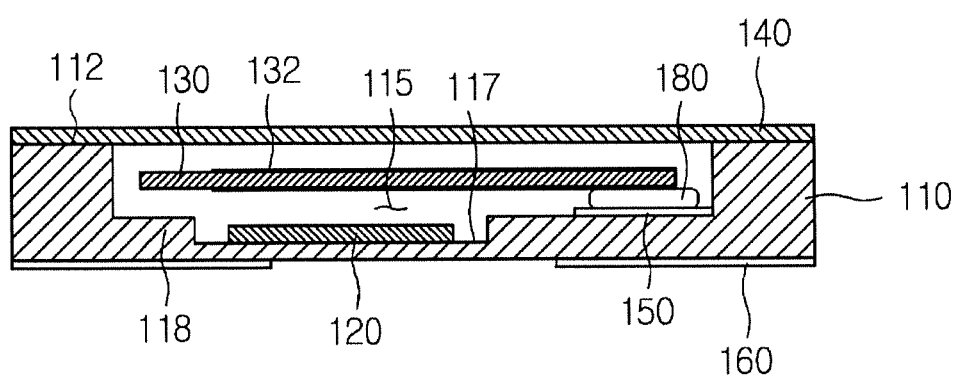
FIG. 3 is a cross-sectional view of the crystal device taken along a line I-I of FIG. 1.

FIG. 2 is an exploded view of the crystal device 100 illustrated in FIG. 1. FIG. 3 is a cross-sectional view of the crystal device 100 taken along a line I-I of FIG. 1.

Referring to FIGS. 2 and 3, the crystal device 100 according to an exemplary embodiment in the present disclosure may include the package 110, a thermistor 120, a crystal blank 130, and the lead 140.

As described above, the package 110 constitutes a portion of an exterior of the crystal device 100 according to the exemplary embodiment in the present disclosure. The package 110 may be formed to have various shapes, and thus, the exterior of the crystal device 100 according to the exemplary embodiment in the present disclosure may have various shapes.

That is, as illustrated in FIG. 2, the package 110 may be a rectangular plate structure or maybe formed as a circular plate or a plate having another shape. In addition, the package 110 may be formed of various materials, for example a ceramic material.

When the package 110 is formed to have a plate shape, the package 110 may have a thickness direction D3, and in particular, when the package 110 is formed as a rectangular plate, the package 110 may also have a length direction D1 and a width direction D2, in addition to the thickness direction D3.

When the package 110 has a plate shape, one surface 114 (please refer to FIG. 4) of the package 110, perpendicular to the thickness direction D3, is flat, and thus, the crystal device 100 may be stably mounted on a substrate to form an electrical connection with an external device or power supply.

A cavity 115 may be formed in the package 110. The cavity 115 maybe formed by recessing a portion of one surface 112 of the package 110, perpendicular to the thickness direction D3 of the package 110, in the thickness direction D3 of the package 110. The cavity 115 may be formed in the package 110 so as to accommodate an electronic device or allow other components to be installed in the package 110.

The cavity 115 formed in the package 110 may have a bottom surface 117 perpendicular to the thickness direction D3 of the package 110 and may have a plurality of lateral surfaces positioned in parallel to the thickness direction D3 and perpendicular to the bottom surface 117. An upper portion of the cavity 115 may be open, and an electronic device or other components may be accommodated in the cavity 115 through the opening of the cavity 115.

The thermistor 120 may be a kind of semiconductor with a resistance value changed according to changes in temperature and may be a positive temperature coefficient thermistor (PTC), a negative temperature coefficient thermistor (NTC), or a critical temperature resistor (CTR).

The PTC may be a positive temperature coefficient thermistor with positive resistance and temperature coefficients and may have properties whereby a resistance value increases as a temperature increases. The NTC may be a negative temperature coefficient thermistor and may have properties whereby a resistance value decreases when a temperature increases, and the CTR may be a critical temperature resistor at a specific temperature.

The thermistor 120 may have a resistance value varied according to changes in temperature and thus may function as a temperature sensor. The thermistor 120 may be formed on the bottom surface 117 of the cavity 115 to be integrated with the package 110. The thermistor 120 may be integrated with the package 110, and thus the thermistor 120 and the package 110 may constitute a single body.

That is, a thermistor as a complete product may not be coupled or attached to the package 110, and the thermistor 120 maybe formed on a portion of the package 110, that is, the bottom surface 117 of the cavity 115 so as to constitute a single body with the package 110. However, the thermistor 120 may also be formed on a lateral surface of the cavity 115, perpendicular to the bottom surface 117, as well as on the bottom surface 117 of the cavity 115.

The thermistor 120 may be a thick film-type thermistor printed and formed on the bottom surface 117 of the cavity 115. In this case, a paste including a composite metal oxide may be printed on the bottom surface 117 of the cavity 115 so as to form the thermistor 120 integrated with the package 110. In addition, the thermistor 120 may be a thin film-type thermistor and may be formed by forming a composite metal oxide on the bottom surface 117 of the cavity 115 via a scheme such as vacuum deposition or sputtering.

That is, the thermistor 120 of the crystal device 100 according to the exemplary embodiment in the present disclosure may be integrated with the package 110 on the bottom surface 117 of the cavity 115 in the form of a thick film or a thin film. Thus, a separate adhesive member, or the like, for attaching or coupling the thermistor 120 to the package 110 is not required. In addition, the thickness of the thermistor may be reduced as compared with that of a conventional stack type thermistor, thereby allowing a crystal device to be miniaturized.

The thermistor 120 may be formed on the bottom surface 117 of the cavity 115 formed in the package 110, and thus may directly detect changes in temperature of the package 110. In addition, the thermistor 120 may be integrated with the package 110 rather than being installed in the package 110 using a separate adhesive member. Thus, information detected by the thermistor 120 may be transmitted without interference by an adhesive material or the like interposed between the thermistor 120 and the package 110 during transmission of the information to the outside. That is, the responsivity of the thermistor 120 may be enhanced.

The crystal blank 130 may be spaced apart from the thermistor 120 in the cavity 115. As illustrated in FIG. 3, the crystal blank 130 may be disposed in the cavity 115 and may be spaced apart from the thermistor 120 formed on the bottom surface 117 of the cavity 115 by a predetermined distance to be disposed on the thermistor 120. In addition, the crystal blank 130 may be installed in the cavity 115 without interference of an internal lateral surface (including bottom and lateral surfaces of the cavity) of the cavity 115.

The crystal blank 130 maybe formed of a natural material such as quartz crystal or formed of artificial crystal with a small amount of impurities and excellent crystallinity. When voltage change having a predetermined level is applied to the crystal blank 130, vibrations may occur in the crystal blank 130 according to an inverse piezoelectric effect.

However, the crystal blank 130 is a device sensitive to changes in temperature and has a vibration frequency that is changed according to changes in temperature. It is very important to maintain a constant vibration frequency of the crystal blank 130 in the crystal device 100. In order to prevent the vibration frequency of the crystal blank 130 from being changed according to temperature, changes in temperature in a space with the crystal blank 130 installed therein need to be measured to compensate for frequency changes of the crystal blank 130, according to changes in temperature.

The crystal device 100 according to the exemplary embodiment in the present disclosure includes the thermistor 120 formed in the same space as the crystal blank 130, that is, in the cavity 115. Thus, changes in temperature in a space in which the crystal blank 130 vibrates may be more accurately measured, and accordingly, an environment in which the crystal blank 130 vibrates at a predetermined frequency may be achieved.

That is, the crystal device 100 according to the exemplary embodiment in the present disclosure includes the thermistor 120 formed in the same space as a space in which the crystal blank 130 is operated. Thus, a temperature of the space in which the crystal blank 130 is operated may be more accurately measured, and the thermistor 120 of the crystal device 100 according to the exemplary embodiment in the present disclosure may be integrated with the package 110. Thus, temperature information measured by the thermistor 120 may be externally transmitted without distortion.

The lead 140 may be coupled to the package 110 so as to cover the cavity 115.

Since the crystal blank 130 that is sensitive to environmental conditions such as temperature and humidity is installed in the cavity 115, it is very important to seal the cavity 115. The lead 140 may be coupled to the package 110 so as to cover the cavity 115, and thus the internal space of the cavity 115 may be sealed.

The lead 140 may be coupled to one surface 112 (refer to FIG. 2) of the package 110, in which the cavity 115 is formed, by adhesives, may be coupled to the package 110 by through a metallic material being dissolved, or may be coupled to the package 110 via a thermal fusion method.

The lead 140 may be formed of a material including a metal or an epoxy resin, and when the lead 140 includes a material including an epoxy resin, the lead 140 may be completely hardened to be adhered to the package 110 while the lead 140, in a semi-hardened state, is stacked on one surface 112 of the package 110.

In addition, the lead 140 may be formed of a material including a heat insulating material in order to block the flow of heat out of the cavity 115 from an internal portion of the cavity 115 or to the inside the cavity 115 from an external portion of the cavity 115 to prevent changes to the internal temperature of the cavity 115.

Figure 4:
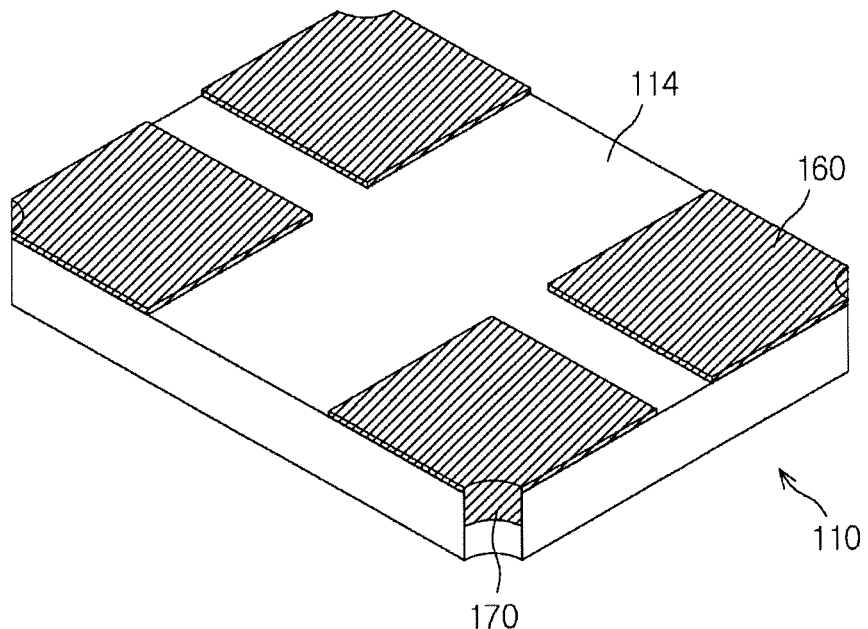
FIG. 4 is a view of a bottom surface of the package illustrated in FIG. 1.

FIG. 4 is a view of a bottom surface 114 of the package 110 illustrated in FIG. 1.

Referring to FIGS. 2 through 4, the crystal device 100 according to the exemplary embodiment in the present disclosure may further include a circuit pattern 150 and an external connection terminal 160.

A plurality of circuit patterns 150 may be formed on an internal lateral surface (including bottom and lateral surfaces of the cavity) of the cavity 115 and may be electrically connected to the thermistor 120 and/or the crystal blank 130. That is, some of the plurality of circuit patterns 150 may be electrically connected to the thermistor 120, and others of the plurality of circuit patterns 150 may be electrically connected to the crystal blank 130. In this case, an electrode 132 that contacts the circuit pattern 150 may be formed on a surface of the crystal blank 130.

The crystal blank 130 may be electrically connected to the circuit pattern 150 so as to receive a change in voltage from an external source and may transmit a vibration frequency of the crystal blank 130 externally. The thermistor 120 may also be electrically connected to the circuit pattern 150 so as to receive a voltage from the outside and to transmit detected information to the outside.

A plurality of external connection terminals 160 may be formed on an external lateral surface (including a surface perpendicular to a thickness direction and a surface positioned in parallel to the thickness direction) of the package 110 and may be electrically connected to at least some of the plurality of circuit patterns 150 formed on the internal lateral surface of the cavity 115.

That is, the external connection terminal 160 may be connected to the circuit pattern 150 electrically connected to the thermistor 120 or the crystal blank 130 so as to electrically connect the thermistor 120 or the crystal blank 130 to the outside.

In this case, the crystal device 100 according to the exemplary embodiment in the present disclosure may further include a plurality of via holes 170 formed through the package 110 so as to electrically connect at least some of the plurality of circuit patterns 150 to the plurality of external connection terminals 160.

As illustrated in FIG. 4, the external connection terminal 160 may be formed on the bottom surface 114 of the package 110 and may be formed of a conductive material. The external connection terminal 160 may be formed on the lateral surface of the package 110 as well as on the bottom surface 114 of the package 110.

The plurality of via holes 170 may be formed through the package 110 and may not be externally exposed, or as illustrated in FIG. 4, the via holes 170 may be formed through the package 110 to be externally exposed. When the via holes 170 are externally exposed, edge portions of the package 110 may be cut to have a curved shape.

Referring to FIGS. 2 and 3, the crystal device 100 according to the exemplary embodiment in the present disclosure may further include a conductive adhesive 180 interposed between the crystal blank 130 and the circuit pattern 150. The conductive adhesive 180 may electrically connect the crystal blank 130 and the circuit pattern 150 to each other and may fix one end of the crystal blank 130 to the circuit pattern 150.

That is, the crystal blank 130 may be installed with a cantilever structure in which one end of the crystal blank 130 is supported by the conductive adhesive 180 in the package 110. However, the crystal blank 130 may not be limited thereto and the crystal blank 130 may be installed in the package 110 such that both ends of the crystal blank 130 are supported.

Figure 5:
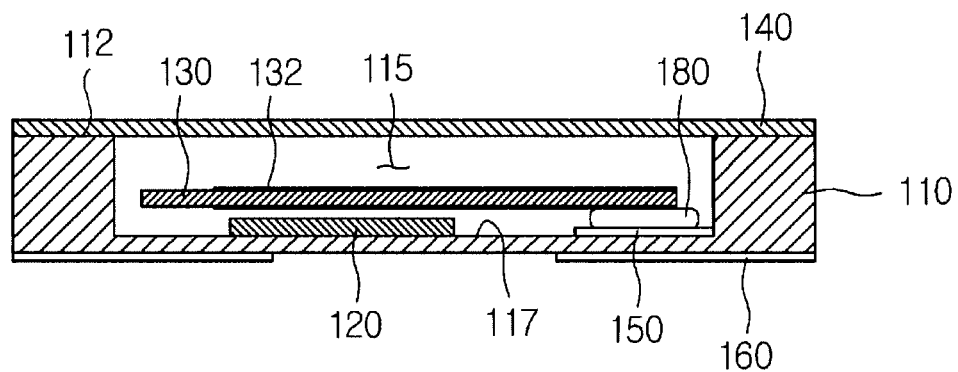
FIG. 5 is a cross-sectional view of a modified embodiment of the crystal device illustrated in FIG. 3.

FIG. 5 is a cross-sectional view of a modified embodiment of the crystal device illustrated in FIG. 3. FIG. is another modified embodiment of the crystal device illustrated in FIG. 3.

Figure 6:
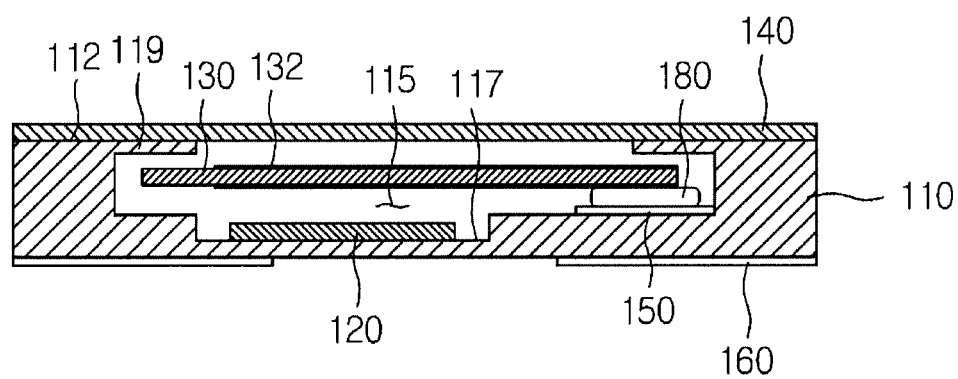
FIG. 6 is another modified embodiment of the crystal device illustrated in FIG. 3.

FIGS. 3, 5, and 6 illustrate the package 110 with various structures.

Referring to FIG. 5, the cavity 115 formed in the package 110 may be recessed in the thickness direction D3 (refer to FIG. 2) of the package 110 from one surface 112 of the package 110. In this case, the cavity 115 may be disposed in parallel to one surface perpendicular to the thickness direction D3 of the package 110. That is, the bottom surface 117 and the thickness direction D3 of the package 110 and may have a plurality of lateral surfaces perpendicular to the bottom surface 117.

The crystal blank 130 may be installed on the bottom surface 117 of the cavity 115. The thickness of the circuit pattern 150 and/or the conductive adhesive 180 which are interposed and stacked between the crystal blank 130 and the bottom surface 117 of the cavity 115 may be increased so as to maintain an interval from the thermistor 120 formed on the bottom surface 117 of the cavity 115.

Referring back to FIG. 3, the package 110 may include a protrusion 118 that protrudes inwardly into the cavity 115 from an internal wall of the cavity 115, that is, a lateral surface perpendicular to the bottom surface 117 of the cavity 115. Since the protrusion 118 is formed in the cavity 115, the cavity 115 may have two different surfaces perpendicular to the thickness direction D3 (refer to FIG. 2) of the package 110 and the two different surfaces may be disposed with a height difference therebetween.

That is, the cavity 115 may have a first bottom surface with the thermistor 120 formed thereon and a second bottom surface higher than the first bottom surface. The second bottom surface maybe a top surface of the protrusion 118. The crystal blank 130 may be installed on the second bottom surface. In this case, since the first bottom surface and the second bottom surface have a height difference therebetween, a constant interval between the crystal blank 130 and the thermistor 120 may be ensured.

The crystal blank 130 may be disposed in the cavity 115 such that one end of the crystal blank 130 is supported by the protrusion 118. That is, the crystal blank 130 may be installed on the top surface of the protrusion 118. In this case, the circuit pattern 150 may be formed on the top surface of the protrusion 118 for forming an electrical connection with the crystal blank 130, and the crystal blank 130 may be electrically connected to the circuit pattern 150 formed on the top surface of the protrusion 118 by the conductive adhesive 180.

Referring to FIG. 6, the package 110 may include a bonding portion 119 that protrudes inwardly within the cavity 115 from an upper portion of an internal wall of the cavity 115 so as to cover a contoured portion of the cavity 115, and the lead 140 may be coupled to the bonding portion 119 of the package 110.

As described above, the cavity 115 may be sealed by the lead 140, and the package 110 may include the bonding portion 119 so as to increase a bonding area in which the lead 140 is bonded to the package 110 to enhance the reliability and durability of sealing by the lead 140.

While exemplary embodiments have been shown and described above, it will be apparent to those skilled in the art that modifications and variations could be made without departing from the spirit and scope of the present disclosure as defined by the appended claims.

What is claimed is:

1. A crystal device comprising:
a package including a cavity formed therein;
a thermistor disposed directly on a bottom surface of the cavity;
a crystal blank spaced apart from the thermistor in the cavity; and
a lead coupled to the package so as to cover the cavity,
wherein the thermistor is a thick film-type thermistor or a thin-film type thermistor.

2. The crystal device of claim 1, further comprising:
a plurality of circuit patterns formed on an internal surface of the cavity and electrically connected to at least one of the thermistor and the crystal blank; and
a plurality of external connection terminals formed on an external surface of the package and electrically connected to at least one of the plurality of circuit patterns.

3. The crystal device of claim 2, further comprising a plurality of via holes in the package to electrically connect at least two of the plurality of circuit patterns and at least two of the plurality of external connection terminals.

4. The crystal device of claim 2, further comprising a conductive adhesive interposed between the crystal blank and one among the plurality of circuit patterns.

5. The crystal device of claim 4, wherein the crystal blank is installed with a cantilever structure in which one end of the crystal blank is supported by the conductive adhesive.

6. The crystal device of claim 1, wherein the package includes a protrusion protruding inwardly into the cavity from an internal wall of the cavity.

7. The crystal device of claim 6, wherein one end of the crystal blank is disposed in the cavity to be supported by the protrusion.

8. The crystal device of claim 1, wherein:
the package includes a bonding portion protruding inwardly into the cavity from an upper internal wall of the cavity so as to cover a portion of the cavity; and
the lead is coupled to the bonding portion.

9. The crystal device of claim 8, wherein the lead contains a material including an epoxy resin.

10. The crystal device of claim 8, wherein the lead includes a material containing a heat-insulating material.

11. The crystal device of claim 1, wherein the thermistor includes a composite metal oxide.

* * * * *